(12) United States Patent
Abali et al.

(10) Patent No.: US 7,944,375 B2
(45) Date of Patent: May 17, 2011

(54) WEAR REDUCTION METHODS BY USING COMPRESSION/DECOMPRESSION TECHNIQUES WITH FAST RANDOM ACCESS

(75) Inventors: Bulent Abali, Hawthorne, NY (US); Mohammad Banikazemi, Hawthorne, NY (US); Dan E. Poff, Hawthorne, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 12/476,297

(22) Filed: Jun. 2, 2009

(65) Prior Publication Data

US 2010/0302077 A1 Dec. 2, 2010

(51) Int. Cl.
*H03M 7/34* (2006.01)
(52) U.S. Cl. .......................................... 341/51; 711/146
(58) Field of Classification Search ............... 341/51; 711/146, 141, 122, 103, 129, 159, 163; 714/7, 714/8; 365/185.29, 200, 185.03, 185.33, 365/185.11, 230.03
See application file for complete search history.

(56) References Cited

U.S. PATENT DOCUMENTS

| | | | |
|---|---|---|---|
| 4,464,650 A | 8/1984 | Eastman et al. | |
| 4,558,302 A | 12/1985 | Welch | |
| 4,814,746 A | 3/1989 | Miller et al. | |
| 5,119,485 A | * | 6/1992 | Ledbetter et al. ............. 711/146 |

OTHER PUBLICATIONS

Abali et al., "Hardware Compressed Main Memory: Operating System Support and Performance Evaluation", IEEE Transactions on Computers, Nov. 2001, pp. 1-14, vol. 50, No. 11.
Banikazemi, "LZB: Data Compression with Bounded References", Mar. 17, 2009.
Bell et al., "Modeling for Text Compression", ACM Computing Surveys, Dec. 1989, pp. 1-35, vol. 21, No. 4.
Franaszek et al., "Data Compression with Restricted Parsings", pp. 1-10.
Sweazey et al., "A Class of Compatible Cache Consistency Protocols and their Support by the IEEE Futurebus", IEEE, 1986, pp. 414-423.
Ziv et al., "A Universal Algorithm for Sequential Data Compression", IEEE Transactions on Information Theory, May 1977, pp. 337-343, vol. IT-23, No. 3.

* cited by examiner

*Primary Examiner* — Joseph Lauture
(74) *Attorney, Agent, or Firm* — Scully, Scott, Murphy & Presser, P.C.; Daniel P. Morris, Esq.

(57) ABSTRACT

The present invention reduces the number of writes to a main memory to increase useful life of the main memory. To reduce the number of writes to the main memory, data to be written is written to a cache line in a lowest-level cache memory and in a higher-level cache memory(s). If the cache line in the lowest-level cache memory is full, the number of used cache lines in the lowest-level cache reaches a threshold, or there is a need for an empty entry in the lowest-level cache, a processor or a hardware unit compresses content of the cache line and stores the compressed content in the main memory. The present invention also provides LZB algorithm allowing decompression of data from an arbitrary location in compressed data stream with a bound on the number of characters which needs to be processed before a character or string of interest is processed.

24 Claims, 9 Drawing Sheets

WEAR REDUCTION METHODS BY USING COMPRESSION/DECOMPRESSION TECHNIQUES WITH FAST RANDOM ACCESS

BACKGROUND

The present invention relates to compressing and decompressing data. More particularly, the present invention relates to reducing the number of writes in a memory device by compressing and/or decompressing data. The present invention also relates to lossless compression and decompression of data.

Wear leveling refers to a technique for prolonging a useful life of non-volatile memories such as Flash memories, EPROM (Erasable Programmable Read-Only Memory), PCM (Phase-Change Memory), etc. Non-volatile memories have erasable segments, each of which can sustain a limited number of erases before becoming unreliable. For example, a segment of NAND-flash memory device becomes unusable between 10,000 erases and 1,000,000 erases. A wear leveling attempts to arrange data so that erasures and re-writes are distributed evenly across the memory devices. In the way, a single segment does not permanently fail due to a number of writes and erases only directed to the single segment.

In a computing device, a cache line refers to a smallest amount of data that can be transferred between a main memory and a cache memory. Rather than reading from or writing to a single word or byte from a main memory at a time, each cache line entry usually holds a certain number of words, e.g., multiple addressable entries. Typically, whole contents of a cache line are read or written to and cached at once. A size of a cache line usually varies from 8 bytes to 512 bytes.

Though a traditional solution utilizes the wear leveling to prolong a useful life of a non-volatile memory, the traditional solution does not try to control the number of writes to minimize degradation of the memory or increase the useful life of the non-volatile memory.

A memory subsystem refers to RAM (Random Access Memory), Single Access Memory (e.g., Single Data Rate Synchronous Dynamic Random Access Memory (SDR-SDRAM) which transfers data only one clock transition), and Dual Access Memory (e.g., Double Data Rate Synchronous Dynamic Random Access Memory (DDR SDRAM) which transfers data on a rising and falling edge of a clock signal thus achieves nearly twice bandwidth of the Single Access Memory).

A storage subsystem refers to a set of components implemented for permanently storing data or programs in a computer. The term "permanent" is used to contrast the storage subsystem from the memory subsystem which holds data temporarily—until the user turns off the computer. The storage subsystem comprises at least one storage device (e.g., hard disk, optical disk, floppy disk, tape drive, magnetic disk, etc.) and a storage device controller (e.g., IDE (Integrated Drive Electronics) interface controller which connect a storage device to a computer).

A lossless data compression/decompression technique refers to a data compression/decompression algorithm that enables the original data to be reconstructed from its compressed version. The lossless data compression/decompression is used in a lot of applications. For example, the lossless data compression/decompression is used in a popular Winzip® application and Unix® gzip (GNU zip) application. Especially, the lossless data compression/decompression is used when it is important that an original data and a decompressed version data be identical.

To decompress a portion of a compressed data stream, traditional lossless data compression/decompression methods needs to start a decompression, e.g., using a LZ77 or LZ78 algorithm, at a beginning of an input data stream and to proceed the decompression to an end of the portion of interest of the compressed data stream. Thus, the traditional lossless data compression/decompression methods cannot decompress anything from an arbitrary location (e.g., a middle of compressed data stream) unless the decompression starts from the beginning of the compressed data stream. The LZ77 algorithm is described at J. Ziv et al., "A Universal Algorithm for Sequential Data Compression", IEEE Transactions on Information Theory, 23(3), 1977, incorporated by reference as set forth herein. LZ78 algorithm is described at Estman, et al., U.S. Pat. No. 4,464,650, incorporated by reference as set forth herein.

Thus, it is desirable to prolong a useful life of a non-volatile memory by reducing the number of writes in the non-volatile memory. Thus, it is also highly desirable to provide a system and method that enables a lossless decompression at any location of a compressed data stream.

SUMMARY

The present invention describes a method and a system for reducing the number of writes in a non-volatile memory to prolong a useful life of the non-volatile memory. The present invention describes a system and method for a lossless compression of an input data stream and a lossless decompression of the compressed data stream. The system and method enables a decompression at any location of a compressed data stream.

In one embodiment, there is provided a method for reducing the number of writes in a main memory of a computer device having a processor, the computer device having one or more levels of cache memory, the method comprising:

receiving a write request to write data;

evaluating whether the data is already in at least one cache memory;

writing the data in the at least one cache memory, if the data is not in the at least one cache memory;

locating compressed data in the main memory, the compressed data corresponding to a previously stored version of the written data;

marking an entry in the main memory corresponding to the compressed data as invalid; and filling a cache line in a lowest-level cache memory with the written data.

In one embodiment, there is provided a system for reducing the number of writes in a main memory, the method comprising:

means for receiving a write request to write data;

means for evaluating whether the data is already in at least one cache memory;

means for writing the data in the at least one cache memory, if the data is not in the at least one cache memory;

means for locating compressed data in the main memory, the compressed data corresponding to a previously stored version of the written data;

means for marking an entry in the main memory corresponding to the compressed data as invalid; and means for filling a cache line in a lowest-level cache memory with the written data.

In one embodiment, there is provided a computer-implemented method for compressing an input data stream, the method comprising:

specifying a gate distance as a particular number of bits and a window size as a certain number of bits;

evaluating whether a current string in the input data stream has been found before within the window size;

locating an origin of symbols in the current string within the input data stream if the current string has been found before within the window size;

calculating a difference between a start position of the current string and a position of the origin;

checking whether the difference is larger than the gate distance;

finding a matching string at the position of the origin if the difference is equal to or less than the gate distance; and replacing the current string with a reference to the matching string and a length of the matching string, wherein a size of the input data stream is reduced by replacing the current string with the reference to the matching string and the length of the matching string.

In one embodiment, there is provided a computer-implemented method for decompressing a compressed data stream, the method comprising:

evaluating whether a current string in the compressed data stream represents a <a reference, a length> pair, the reference indicating a location of an original string corresponding to the current string in the compressed data stream, the length indicating the number of symbols in the original string;

finding an original string at a position of the reference, the original string having the length number of symbols, if the current string is the pair; and replacing the current string with the original string, wherein the compressed data stream is reconstructed to an uncompressed data stream by replacing the current string with the original string.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DETAILED DESCRIPTION

In one embodiment, to perform a decompression or compression of a current string, a computing system (e.g., a system 1600 in FIG. 6) observes a certain number of preceding characters of the current string for discovering any match, e.g., a current string is same as a previous string. Strings including these preceding characters/symbols are called a window. The number of these characters/symbols is called a window size.

Figure 4:
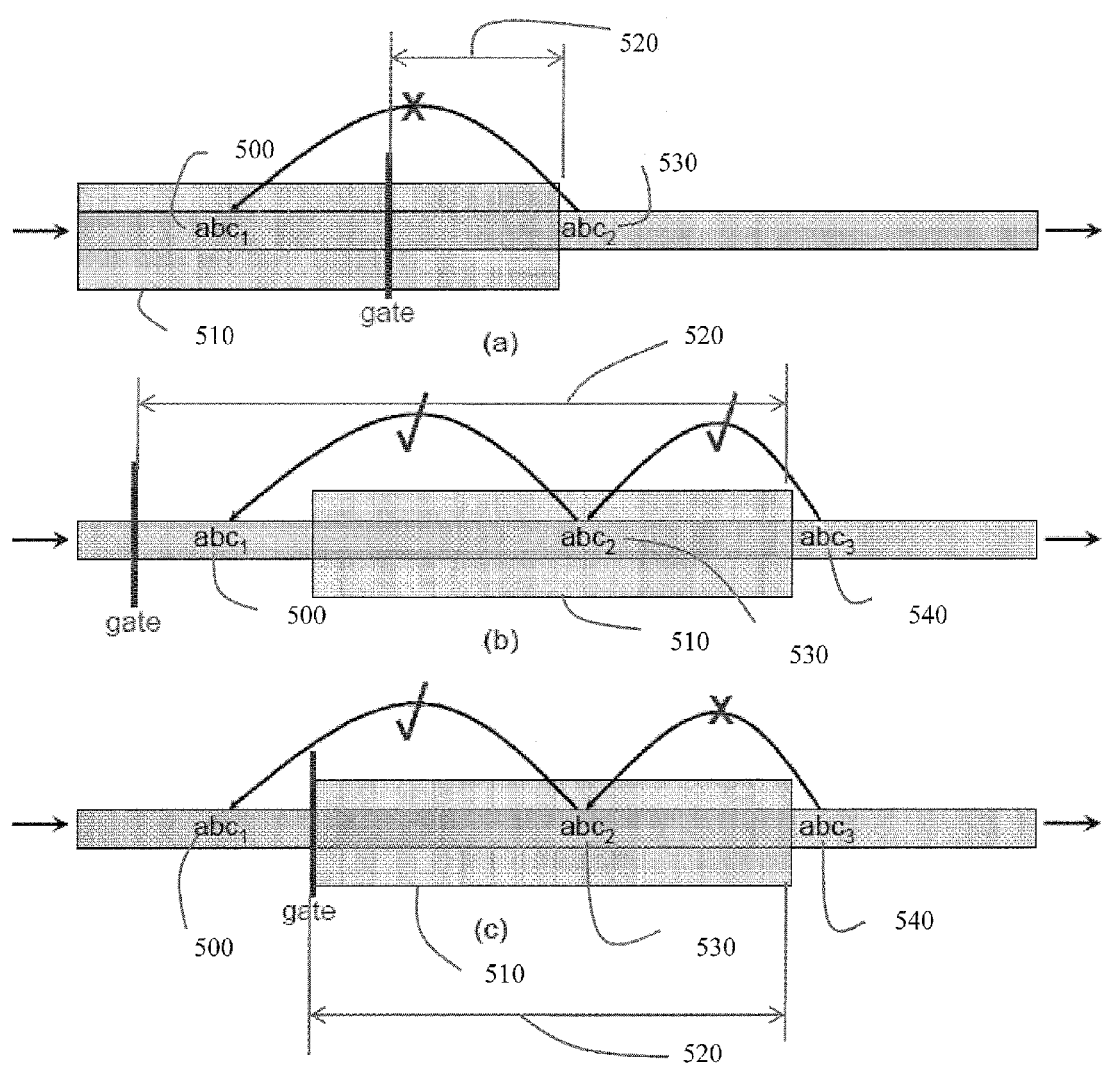
FIG. 4 illustrates an exemplary embodiment.

In one embodiment, there is specified a parameter called "gate". The gate limits a distance a pointer or reference can point or refer backward. That is, a gate distance means a distance in the number of positions (bytes/characters/symbols) which a reference or pointer can refer back directly or indirectly through one or more cascading references or pointers, e.g., as shown in FIG. 4(*b*). If a match is found beyond the gate distance, the match is ignored. Cascading references or pointers refer to two or more references or pointers being sequentially pointing back to an original string. By defining the gate distance, a computing system (e.g., a system 1600 in FIG. 6) performing a decompression and a compression can recognize that a given portion of data refers to or depends on at most "gate distance" number of preceding characters/symbols. Thus, using the gate and/or gate distance, the computing system can decompress from any location in a compressed data stream by starting a decompression from a "gate distance" number of characters/symbols preceding the data that a user is interested in. (How to decompress is described in detail with FIG. 2.)

Figure 1:
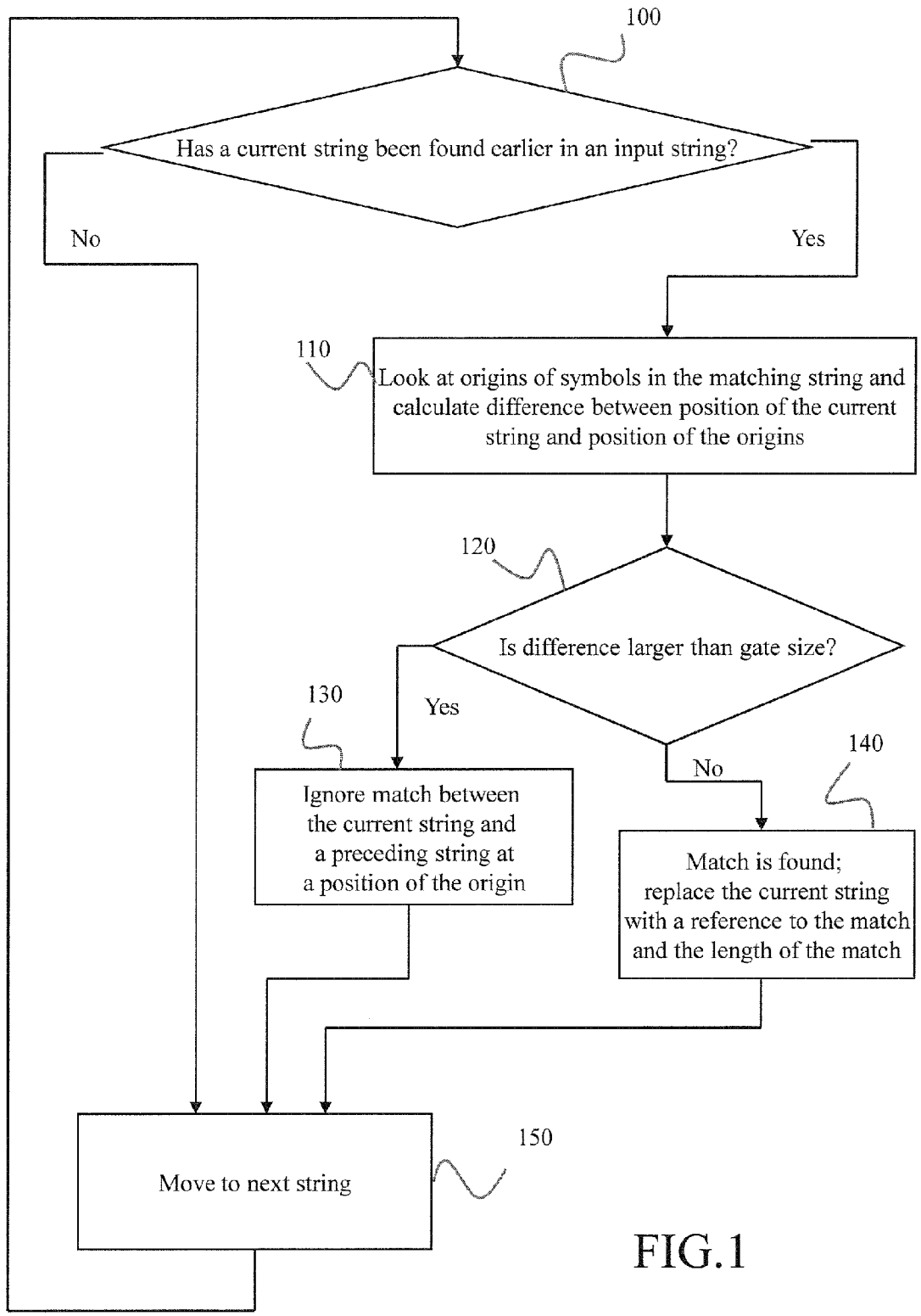
FIG. 1 illustrates a flow chart describing method steps for compressing an input data stream according to one embodiment.

In a further embodiment, the gate distance provides a bound on how far back reference(s) or pointer(s) can refer. By specifying or defining the gate distance as a particular number of bits or number of bytes, the computing system can decompress from any location of a compressed data stream without being required to start the decompression from a beginning of the compressed data stream. Thus, the computing system can compress a large input data stream (e.g., 1 terabyte data) at once from a beginning to an end, while the computing system provides a random access (random decompression) to the compressed input data stream. FIG. 1 describes detailed method steps for performing the compression according to one embodiment of the present invention.

A computing system (e.g., a system 1600 in FIG. 6) including a general purpose processor (e.g., a CPU 1611, IBM® PowerPC®, Intel® Core) specifies a gate distance as a particular number of bits or number of bytes and specifies a window size as a certain number of bits or number of bytes. The system or the processor receives an input data stream e.g., from another computing system via a network or from an input/output device such as a keyboard (e.g., a keyboard 1624 in FIG. 6). At step 100, the system or the processor evaluates whether a current string in the input data stream has been found or observed before in the input data stream within the window size. If the system or the processor has not observed or found the current string before in the input data stream within the window size, at step 150, the computing system starts to evaluate a next string in the input data stream. Otherwise, at step 110, the system or processor locates an origin of symbols/characters in the current string. The origin of the symbols/characters refers to a location of a preceding string matching with the current string. The origin may be located in the input data stream within the "window size" number of symbols/characters preceding the current string. For example, if the window size is 80 characters, the origin may be located within 80 characters ahead of the current string. Then, the system or the processor calculates a difference between a start position of the current string and a position of the origin.

Then, at step 120, the system or the processor evaluates whether the calculated difference is larger than the gate distance. If the difference is larger than the gate distance, at step 130, the system or the processor ignores a match between the current string and the preceding matching string at a position of the origin. For example, if the gate distance is 80 characters and the difference is 100 characters, the system or the processor ignore the match. Otherwise, at step 140, the match is affirmed, i.e., the system or the processor finds a valid preceding string matching with the current string at the position of the origin. The system or the processor replaces the current string with a reference or pointer to the valid preceding matching string and the length of the match. For example, if the current string is "abcde", and the valid preceding matching string is "abc", and the preceding matching string is located at $0003 (a physical memory address 0003), then the current string "abcde" is replaced with a pointer to $0003 "de" and 3 (the length of the match; the number of characters in the match). Because a size of a pointer/reference is less than a size of a string, replacing the current string with the reference to the valid preceding matching string compresses or reduces a size of the input data stream. After executing the steps 130 or 140, at step 150, the system or processor start to evaluate a next string in the input data stream, e.g., by moving to the next string, setting the next string as the current string, and repeating steps 100-140. The system or the processor reduces or compresses the size of the input data stream by an amount equal to a size of the current string—a size of the reference at each iteration having the replacement.

In a further embodiment, a memory subsystem or storage subsystem may store the input data stream and/or the reduced or compressed input data stream.

In a further embodiment, the valid preceding matching string may exactly match with the current string. In another embodiment, the valid preceding matching string may partially match with the current string.

In a further embodiment, the system includes an external dictionary (now shown). The external dictionary is a separate object such as an array, list or vector. The external dictionary may include commonly used text and/or character strings, e.g., by incorporating an English book (e.g., an elementary school English textbook). The external dictionary may further include invalid preceding matching string(s) (i.e., a preceding string which is matching with the current string but cannot be referenced because the preceding string resides outside the gate distance).

In an alternative embodiment, referring to FIG. 1, when the external dictionary is used, at step 100, the system or the processor also evaluates whether the current string is finds at the external dictionary. If the external dictionary has an entry corresponding to the current string, at step 110, the system or the processor locates the entry including a string matching with the current string. Then, at step 140, the system or the processor may replace the current string with a reference to the entry or a reference to the matching string in the external dictionary and the length of the matching string. When the system or the processor finds a valid matching string in the external dictionary and the same valid matching string at the origin of symbols/characters in the input data stream, the system or processor may replace the current string with a reference/pointer to the origin in the input data stream. In another embodiment, when the system or the processor finds a valid matching string in the external dictionary and the same valid matching string at the origin of symbols/characters in the input data stream, the system or processor may replace the current string with the reference/pointer to the entry or the reference to the matching string in the external dictionary.

When the system or the processor utilizes the external dictionary as well as the input data stream (the origin of the symbols/characters in the input data stream) to replace the current string with a reference, the input data stream can be more compressed or reduced because more strings can be replaced with references. Thus, the size of the input data stream is even further reduced or minimized when the system or the processor utilizes the external dictionary as well as the input data stream (the origin of the symbols/characters in the input data stream).

Figure 3:
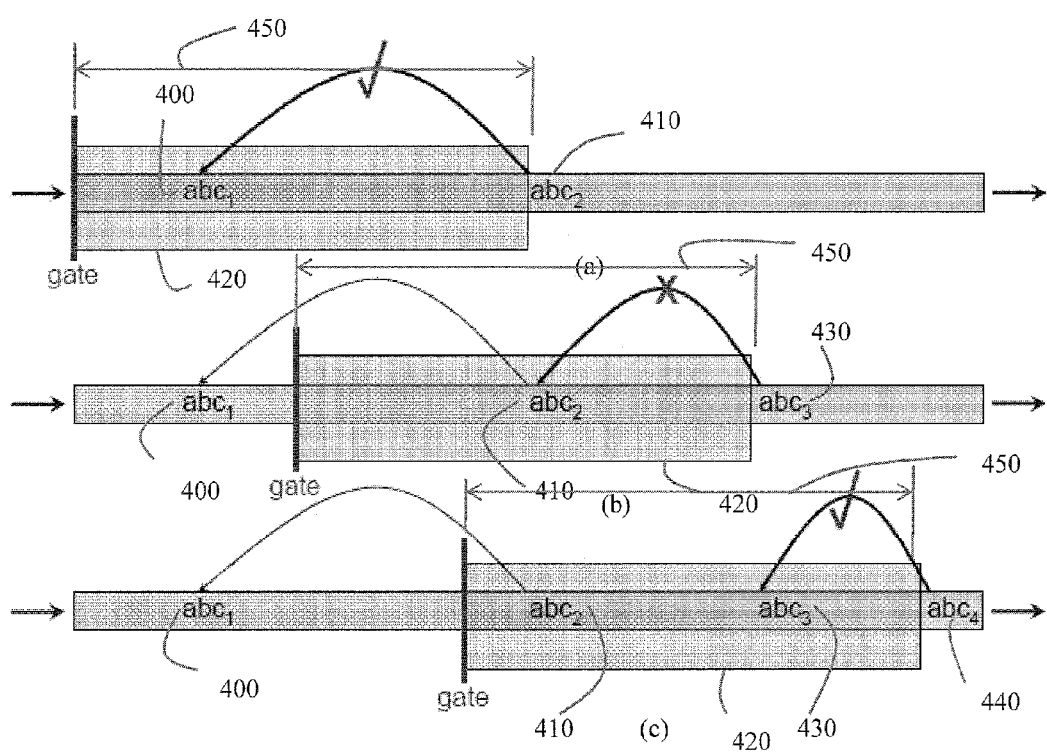
FIG. 3 illustrates an exemplary embodiment.

FIG. 3 illustrates an exemplary embodiment of compressing data in accordance with the invention. In this exemplary embodiment, the gate distance 450 is set to be same as the window size 420. This setting is only for this exemplary embodiment. The gate distance 450 can be set larger than, less than or equal to the window size. In FIG. 3(*a*), as a computing system (e.g. a system 1600 in FIG. 6) starts a compression, the system encounters an exemplary character string "abc1" (400) and records the "abc1" (400), e.g., in a dictionary (e.g., an object such as an array, list or vector). When the system reaches an exemplary character string "abc2" (410), the system discovers a match between the "abc1" (400) and "abc2" (410), e.g., by finding a matching string "abc" common to "abc1" (400) and "abc2" (410). Because a distance between the "abc1" (400) and the "abc2" (410) is less than the gate size, the system replaces the matching string "abc" in the "abc2" with a reference to the "abc1" (400) and a length of the matching string (i.e., 3). (The number 3 indicating the length of the matching string is not shown in FIG. 3.) As shown in FIG. 3(*b*), when the system reaches an exemplary character string "abc3" (430), the system finds that a string "abc" in the "abc3" (430) has been identified before. In other words, the system finds a match between the "abc2" and the "abc3". Then, the system calculates a distance between an origin of the "abc" (i.e., the "abc1" (400)) and the "abc3" (430) by assuming a replacement of the "abc3" (430) with a reference to the "abc2" (410) which eventually creates a cascade of two references (e.g., "abc3" refers to "abc2". "abc2" refers to "abc1"). Thus the cascade of the two references makes the "abc3" (430) refer "abc1" (400). However, as shown in FIG. 3(*b*), a distance that the cascade of the two references creates (i.e., a distance between "abc1" and "abc3") is larger than the gate distance 450. Thus, the system ignores the match between the "abc2" (410) and the "abc3" (430). Therefore, the "abc3" (430) is not replaced by a reference to the "abc2" (410). As shown in FIG. 3(*c*), when the system reaches "abc4" (440), the system finds a valid match between the "abc3" (430) and the "abc4" (440) because a distance between the "abc3" (430) and the "abc4" (440) is less than the gate size 450. Thus, the system replaces a matching string "abc" in the "abc4" (440) with a reference to "abc3" (430) and the length of the matching string "abc" (i.e., 3).

FIG. 4 illustrates a relationship between a gate distance and a window size. As shown in FIG. 4(*a*), if a gate distance 520 is less than a window size 510, the system may invalidate a match (e.g., a match between "abc1" (500) and "abc2" (530), which would be valid if the gate distance 520 was equal to the window size 510 as shown in FIG. 3(*a*). Thus, if the gate distance 520 becomes less than the window size 510, an effective window size is reduced to the gate distance 520. As shown in FIG. 4(*b*), if the gate distance 520 is larger than the widow size 510, referencing an origin of symbols/characters goes beyond the window size 510. Thus, the larger gate distance allows a match (e.g., a match between "abc2" (510) and "abc3" (540)) which would be invalid if the gate distance 520 was equal to the window size 510 as shown in FIG. 3(*b*). FIG. 4(*b*) illustrates a cascade of two references ("abc3" refers to "abc2"; "abc2" refers to "abc1"; thus, "abc3" eventually refers to "abc1") is valid, because a distance between the "abc3" (540) and the "abc1" (500) is less than the gate distance 520. As shown in FIG. 4(c), when the gate distance 520 is equal to the window size 510, only references which end within the gate distance 520 are allowed. For example, a match between "abc1" (500) and "abc2" (530) is valid, because the distance between the "abc1" (500) and the "abc2" (530) is less than the gate distance 520. However, a match between the "abc2" (530) and "abc3" (540) is invalid, because replacing the "abc3" (540) with a reference to "abc2" (530) creates a cascade of two references. The cascade of the two references eventually makes the "abc3" (540) refers the "abc1" (500). A distance of the "abc3" (540) and the "abc1" (500) is larger than the gate distance 520. Thus, FIG. 4(c) illustrates the match between the "abc2" (530) and "abc3" (540) is invalid.

The larger a gate distance, the higher potential compression, because more strings can be replaced with references. However, as the gate distance increases, an average amount of data which needs to be decompressed for accessing data at a random location increases. When the gate distance is the same or larger than a size of an input data stream to be compressed, the present invention may implement LZ77 compression/decompression technique in which there is no limit on how far a cascade of references or a reference can go back. In a preferred embodiment, the system sets a gate distance larger than a window size. However, the gate distance may be less than the size of the input data stream.

If the system decompresses compressed data stream from a beginning of the data stream to an end of the data stream, the system may utilize the LZ77 or LZ78 algorithm incorporated by reference herein.

However, in order to decompress the compressed data stream from an arbitrary location in the compressed data stream, the system needs to know where to start from. To enable the system to start a decompression at any arbitrary location, the system maintains a list of markers specifying mappings between positions in uncompressed data stream and positions in the compressed data stream. In another embodiment, the list of markers specifies which symbol in uncompressed data stream corresponds to which symbol in the compressed data stream. After finding a starting position to decompress in the compressed data stream, e.g., by using the list of markers, the system starts a decompression from at most the "gate distance" number of characters/symbols before the starting position. (Decompressing compressed data stream at an arbitrary location of the compressed data is described in detail with FIGS. 2 and 5.)

Figure 2:
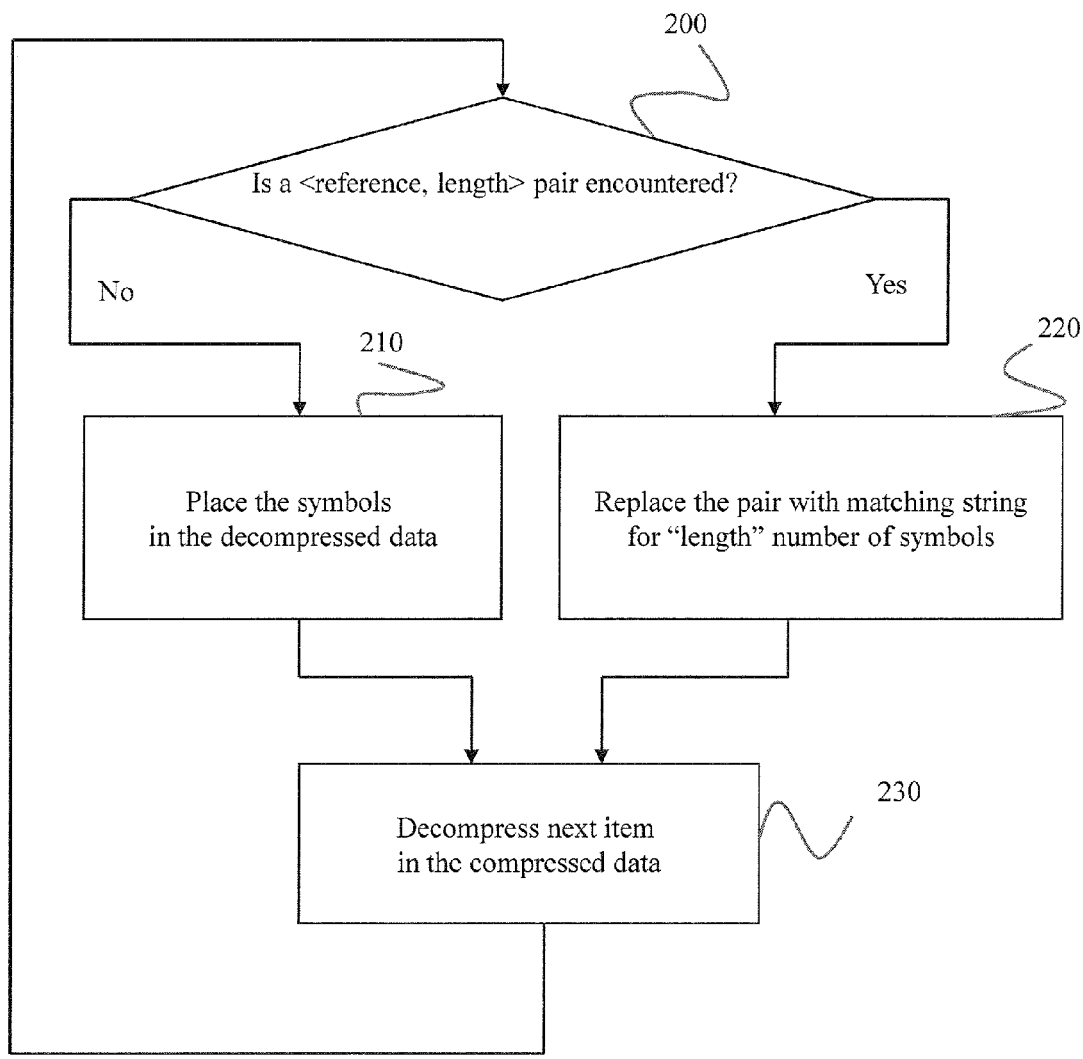
FIG. 2 illustrates a flow chart describing method steps for decompressing compressed data stream according to one embodiment.

FIG. 2 illustrates a flow chart describing method steps for decompressing compressed data stream at an arbitrary location of the compressed data stream without decompressing from the beginning of the compressed data stream. A computing system (e.g., a system 1600 in FIG. 6) including a general purpose processor (e.g., a CPU 1611, Intel® Core®, IBM® PowerPC®) receives compressed data stream, e.g., from another computing system(s) or via a network. A user may request the system or the processor to uncompress a specific string or symbol from the compressed data stream. Then, the system or the processor looks up the list of markers to find a location of the specific string or symbol in the compressed data stream. The system or the processor starts to decompress strings or symbols from the "gate distance" number of symbols/characters ahead of the location of the specific string or symbol to the location of the specific string or symbol by executing following steps. At step 200, the system or the processor evaluates whether a current symbol or string represents a <a reference, a length> pair, which indicates the current symbol or string is a compressed symbol or string. (A current string or symbol refers to a string or symbol currently processed by the processor or the system.) The reference in the pair indicates a location (e.g., physical memory address) of an origin of the compressed current symbols/string. The origin may include an original string of the compressed current symbols/string. Alternatively, the origin may be another <a reference, a length> pair. If the origin is another pair, there is a cascade of two or more references within the gate distance. By following the references, the system or the processor eventually locates an original string of the current compressed symbols/string. The length indicates that the original string has the "length" number of characters/symbols. For example, if the system or the processor wants to decompress a compressed string corresponding to an uncompressed string (540) in FIG. 4(b), the system first locates the compressed string by using the mappings in the list of markers. At a position of the compressed string (540) in compressed data stream, the system or the processor may find a reference to a position (530) and a number 3 (the length; the number of characters/symbols in the original string). Then, when locating the position (530), the system or the processor may find a reference to another position (500) and the number 3. Then, by locating the position (500), the system or the processor eventually finds an original string "abc", whose length is three, i.e., "abc" includes three characters.

Returning to FIG. 2, at step 220, if the current symbol or string represents the <a reference, a length> pair, the system or the processor finds the original string at a position of the reference, or at a position of a last reference in case of a cascade of two or more references. Then, the system or the processor replaces the current symbol with the original string. Alternatively, the system or the processor may place the original string in an output stream including an uncompressed version of the compressed data stream.

Otherwise, at step 210, the system or the processor places the current symbol or string in an output stream, because the current symbol or string is not compressed symbol or string. Alternatively, the system or the processor may not do anything when the system or the processor finds an uncompressed symbol or string in compressed data stream. At step 230, the system or the processor starts to process a next symbol or string (i.e., a string or symbol next to the current string) in the compressed data stream, e.g., by executing method steps 200-220.

Thus, the system or the processor reconstructs uncompressed data stream by replacing the compressed current symbol or string with an original string, placing the original string in the output stream and placing an uncompressed string or symbol in the output stream.

The system or processor can executes the method steps 200-230 at any position of the compressed data stream by using the list of markers without requiring starting from a beginning of the compressed data stream, because the list of markers can point to a specific position in the compressed data stream to start the method steps. After finding the specific position, the system or the processor needs to execute the method steps 200-230 at most from the "gate distance" number of symbols/characters ahead of the specific position.

In a further embodiment, when an external dictionary storing the commonly used strings, the reference may indicate a position of an original string in the compressed data stream (a position of an origin of the compressed current string) or an entry location including the original string in the external dictionary.

Figure 5:
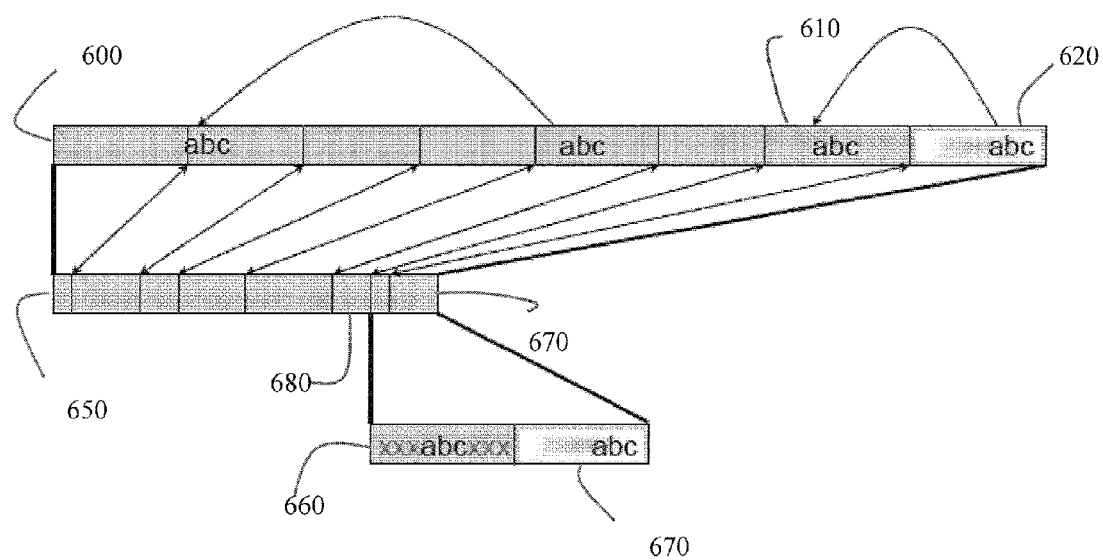
FIG. 5 illustrates an exemplary embodiment.

FIG. 5 illustrates an exemplary embodiment for performing a decompression. In this exemplary embodiment, it is described to decompress a segment including a last occurrence of a phrase (string), e.g., a string "abc". Then, the system searches the list of markers (not shown) to find which segment in compressed data stream 650 includes the last occurrence of the phrase "abc". An entry in the list of markers may indicate a last segment 670 in the compressed data stream 650 that may include the last occurrence of the phrase "abc". (In this example, it is assumed that a segment size is the same as the gate distance. A segment refers to a partition or portion of data, e.g., compressed data stream) Thus, to decompress contents of the last segment 670 in the compressed data stream 650, the system starts to decompress from the seventh segment 660 (the second to the last segment), because decompressing from at most the "gate distance" number of characters/symbols enables a complete decompression of the last segment 670, Because a reference to a preceding string cannot be beyond the gate distance, if a string in the last segment 670 in the compressed data stream 650 includes a reference, the reference cannot go back beyond the gate distance, which is the seventh segment 660. Thus, the system starts to decompress from the seventh segment 660. While decompressing the seventh segment, parts of the seventh segment may remain unknown, e.g., by including a reference referring back to an origin in the sixth segment 680. Thus, if the string in the seventh segment 660 is a compressed string (e.g., a <a reference, a length> pair), the system remains the "length" number of symbols/characters aside and moves to a next string to decompress rest of data in the seventh segment and the eighth segment 670. Since, no character or symbol in the last segment 670 can have a reference to any symbol or character beyond the seventh segment (the second to the last segment), (because the gate distance is the same as the segment size), the system completely decompresses the last segment 670 in the compressed data stream 650. Thus, the system may generate an uncompressed data stream 600 including a partially uncompressed seventh segment 610 and a fully uncompressed eighth segment 620.

As more entries in the list of markers are provided, there are less amount of data to decompress, because the more entries may indicate more locations in the compressed data stream. However, as the number of markers (e.g., the number of mappings between positions in uncompressed data stream and positions in compressed data stream) in the list increases, the system may store the list of markers as compressed data. Thus, a size of compressed data increases as the number of markers increases. Therefore, depending on a need for higher compression ratios or faster decompression speed, the number of markers may be set. If a user wants higher compression ratios, the list of markers should have less markers. If a user wants faster decompression speed, the list of markers should have more markers.

In one embodiment, the method steps in FIGS. 1 and 2 are implemented in hardware or reconfigurable hardware, e.g., FPGA (Field Programmable Gate Array) or CPLD (Complex Programmable Logic Device), using a hardware description language (Verilog, VHDL, Handel-C, or System C). In another embodiment, the method steps in FIGS. 1 and 2 are implemented in a semiconductor chip, e.g., ASIC (Application-Specific Integrated Circuit), using a semi-custom design methodology, i.e., designing a chip using standard cells and a hardware description language. Thus, the hardware, reconfigurable hardware or the semiconductor chip executes the method steps described in FIGS. 1-2.

Figure 6:
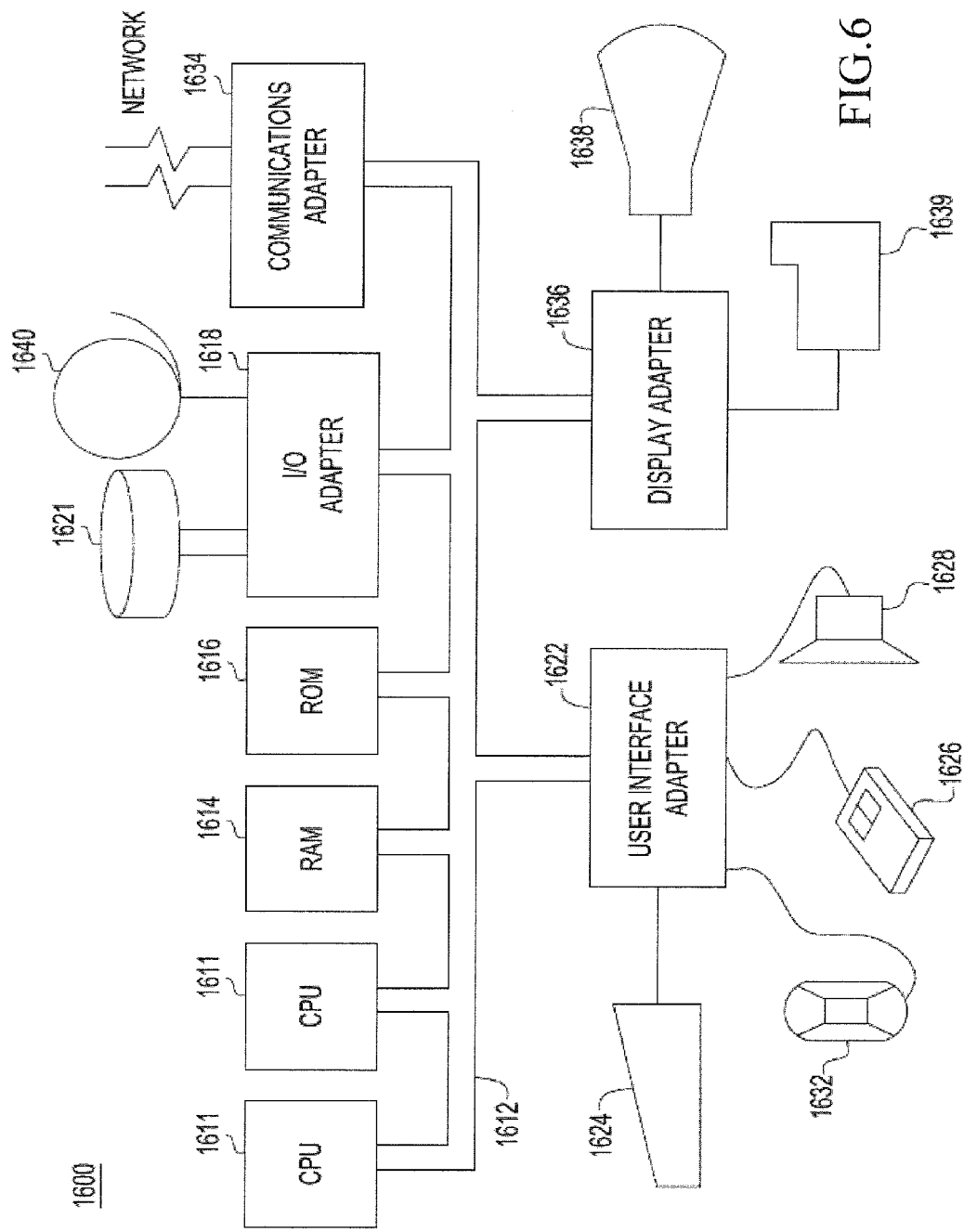
FIG. 6 illustrates hardware configuration implementing one embodiment.

FIG. 6 illustrates a hardware configuration of a computing system 1600 executing and/or implementing the method steps in FIGS. 1 and 2. The hardware configuration preferably has at least one processor or central processing unit (CPU) 1611. The CPUs 1611 are interconnected via a system bus 1612 to a random access memory (RAM) 1614, read-only memory (ROM) 1616, input/output (I/O) adapter 1618 (for connecting peripheral devices such as disk units 1621 and tape drives 1640 to the bus 1612), user interface adapter 1622 (for connecting a keyboard 1624, mouse 1626, speaker 1628, microphone 1632, and/or other user interface device to the bus 1612), a communication adapter 1634 for connecting the system 1600 to a data processing network, the Internet, an Intranet, a personal area network (PAN), etc., and a display adapter 1636 for connecting the bus 1612 to a display device 1638 and/or printer 1639 (e.g., a digital printer of the like).

In one embodiment, a general purpose processor (e.g., IBM® PowerPC®, Intel® Core®) attempts to reduce a wear of a non-volatile memory (i.e., increase useful life of the non-volatile memory) by reducing the number of writes in the non-volatile memory. In order to reduce the number of writes in the non-volatile memory, the processor compresses data before writing and decompresses data when there is a need to access content for reading. In a further embodiment, the processor may execute one or more of compression/decompression algorithm such as LZ77, LZ78, LZW and LZB to compress and/or decompress data. Jacob Ziv, et al., "A Universal Algorithm for Sequential Data Compression", IEEE transactions on information theory, Vol. IT-23, No. 3, May 1977, incorporated by reference as set forth herein, describes the LZ77 algorithm. Eastman, et al., U.S. Pat. No. 4,464,650, incorporated by reference as set forth herein, describes the LZ78 algorithm. Victor S. Miller, et al., U.S. Pat. No. 4,814, 746, incorporated by reference as set forth herein, describes the LZW algorithm. Welch, "U.S. Pat. No. 4,558,302, incorporated by reference as set forth herein, also describes the LZW algorithm. As described above, FIGS. 1-5 illustrates the LZB algorithm. Mohmmad Banikaemi (a co-inventor of the present invention), "LZB: Data Compression with Bounded References", Data Compression Conference, Mar. 16, 2009, incorporated by reference as set forth herein, also describe the LZB algorithm. In order to achieve high compression rates (e.g., compressing 100 megabytes to 5 megabytes), the processor compresses a large amount of data (e.g., 1 KB), e.g., by executing one or more of the compression/decompression algorithm, and stores the compressed data in a battery-backed volatile (non-wearing) RAM. When the processor executes LZ77, LZ78 or LZW algorithm, a decompression needs to be performed from a beginning of compressed data. However, when the processor executes LZB algorithm (i.e., method steps described in FIGS. 1-2), the processor can start decompression at any location of compressed data. In one embodiment, a non-volatile memory is used as a main memory, not a replacement of disk storage. In one embodiment, the main memory stores only compressed data. Cache memory(s) stores only uncompressed data.

Figure 7:
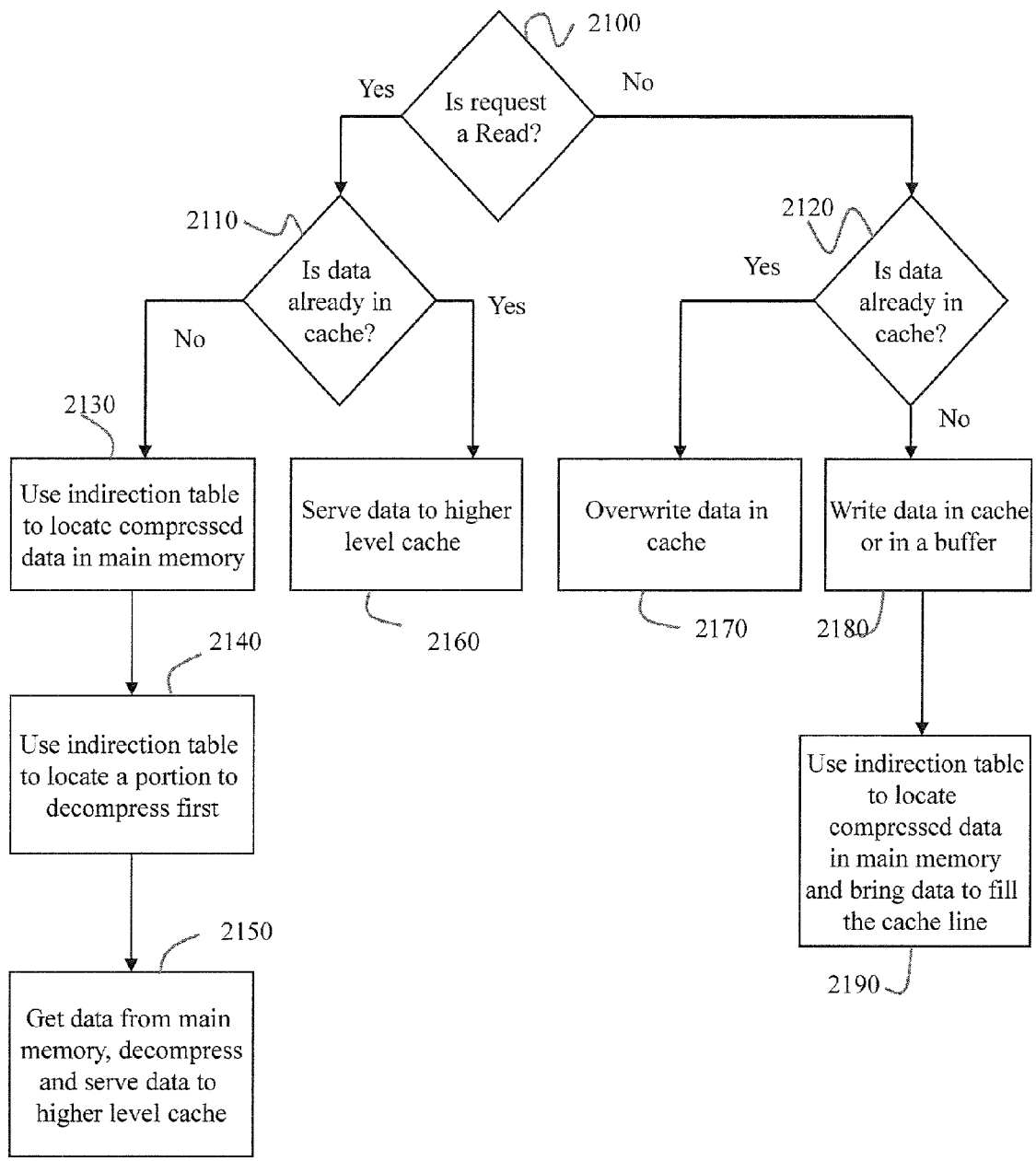
FIG. 7 illustrates a flow chart describing method steps for reducing the number of writes in a non-volatile memory according to one embodiment.
Figure 8:
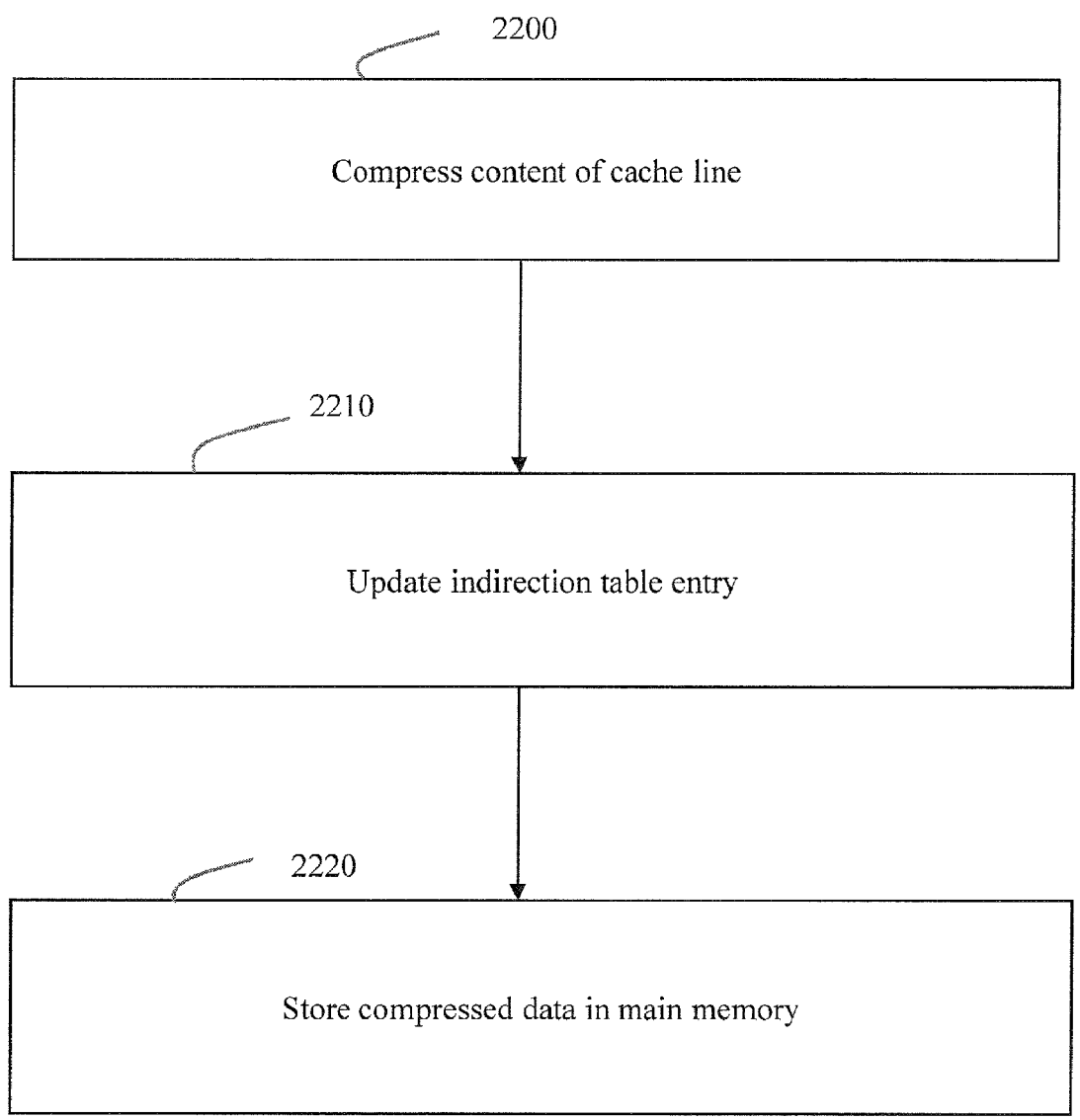
FIG. 8 illustrates a flow chart describing method steps for reducing the number of writes in a non-volatile memory according to one embodiment.

FIGS. 7-8 illustrates flow charts describing method steps for reducing the number of writes in a main memory. At step 2100, a processor evaluates whether a request is a read request (i.e., reading data from the main memory) or a write request (i.e., writing data to main memory). If the request is the write request, after receiving the write request, the processor evaluates whether the at least one cache memory already had an entry for an address associated with the write request at step 2120. In one embodiment, there are two-level cache memories such as a first-level cache memory (highest-level cache memory) and a second-level cache memory (lowest-level cache memory). In another embodiment, there are three-level cache memories such as a first-level cache memory (highest-level cache memory), a second-level cache memory, a third-level cache memory (lowest-level cache memory).

At step 2170, if the at least one cache memory had the entry, the processor overwrites data in the entry in the at least one cache memory with the data provided with the write request. Otherwise, at step 2180, the processor writes the provided data in the at least one cache memory according to a cache coherence scheme (e.g., write-once protocol, Dragon protocol). Paul Sweazey, et al., "A Class of Compatible Cache Consistency Protocols", IEEE 1986, incorporated by reference as if fully set forth herein, describes diverse cache coherency protocols.

At step 2190, the processor locates compressed data corresponding to the data written to the at least one cache memory. The corresponding compressed data may be located in the main memory. The corresponding compressed data may include an old version of the data written to the at least one cache memory. After locating the corresponding compressed data in the main memory, the processor marks an entry (an entry in the main memory) associated with the corresponding compressed data as invalid. At the same time, the processor may write the written data in a cache line in a lowest-level cache memory. The cache line in the lowest-level cache memory may include 1 KB data. The cache line in the lowest-level cache memory may include a plurality of data associated with a plurality of write requests issued from the higher level cache memory(s) or the processor.

To locate the corresponding data in the main memory, the processor implements an indirection table. An entry in the indirection table describes how a cache line is compressed. The entry in the indirection table includes information of a size of the corresponding compressed data and where the corresponding compressed data is stored in the main memory. The entry in the indirection table may store a location of the corresponding compressed data in terms of physical memory address(es). In other words, each entry in the indirection table includes an address indicating a location of the compressed data stored in the main memory. The indirection table performs a logical and physical address translation by mapping a local address to a physical address in the main memory. The indirection table may be used for an address translation between a logical address of the at least one cache memory and a physical address in the main memory At step 2200 in FIG. 8, when the cache line in the lowest-level cache memory is full, the number of used cache lines reaches a threshold, or there is a need for an empty entry in the lowest-level cache memory, then the processor compresses content of the cache line. After compressing the content of the cache line, at step 2210, the processor updates an entry of the indirection table. For example, an indirection table entry corresponding to the cache line may be updated/created to include physical address(es) of the main memory storing the compressed content of the cache line. At step 2220, the processor stores the compressed content of the cache line in the main memory.

As a result of compressing the content of the cache line, the processor writes fewer amounts of data to the main memory. As a result of compressing the content of the cache line, the processor performs less number of writes to the main memory.

The processor may compress content of the cache line by executing LZ77, LZ78, LZW and/or LZB algorithm. Because the processor compresses a cache line (e.g., 1 KB cache line) in the lowest-level cache memory and the cache line in the lowest-level cache memory has larger size than a cache line (e.g., 8 bytes cache line) in higher-level cache memory, the processor achieves a high compression rate, e.g., compressing 1 KB data to 10 byte data; i.e., compressing more amounts of data.

While compressing content of a cache line in the lowest-level cache memory, the processor may store markers along with the compressed content in the main memory. The markers may refer to beginning of each cache line in higher-level cache memories or a group of cache lines in higher-level cache memories in the compressed content. While writing the compressed content to the main memory, the processor stores information of where each cache line of a higher-level cache memory is stored in the compressed content. This information may be stored as an entry in the indirection table. Looking up an entry in the indirection table or writing/updating an entry in the indirection table may take negligible time when compared to time accessing data in the main memory.

If a cache line is logically divided into segments, a corresponding entry in the indirection table stores a location of a beginning of each segment in the compressed content of the cache line.

Returning to FIG. 7, at step 2100, when the request is the read request, the processor evaluates whether data to read exists in the at least one cache memory. In other words, the processor evaluates whether address(es) of the data to be read is found in the at least one cache memory. If the at least one cache memory has the data, at step 160, the at least one cache memory serves the data to the processor. If the lowest-level cache memory has the data, the lowest-level cache memory may serve the data to higher-level cache memory(s) and/to the processor.

If, at step 2110, it is determined that the at least one cache memory does not have the data to read, the processor looks up the indirection table to find physical addresses of the main memory storing the data at step 2130. If the read request was reading a portion (e.g., a specific segment) in the compressed content (i.e., a compressed cache line stored in the main memory) rather than reading the whole compressed content, at step 2140, the processor may locate that portion in the compressed content by using an entry in the indirection table. The entry in the indirection table may specifically indicate where that portion (e.g., the specific segment) is stored in the compressed content. At step 2150, the processor decompresses that portion (e.g., specific segment) in the compressed content, e.g., by using LZB algorithm. Then, the processor serves the decompressed portion to the at least one cache memory and/or the processor. The processor may decompress from any arbitrary location of the compressed content without starting to decompress from a beginning of the compressed content, e.g., by using LZB algorithm.

Figure 9:
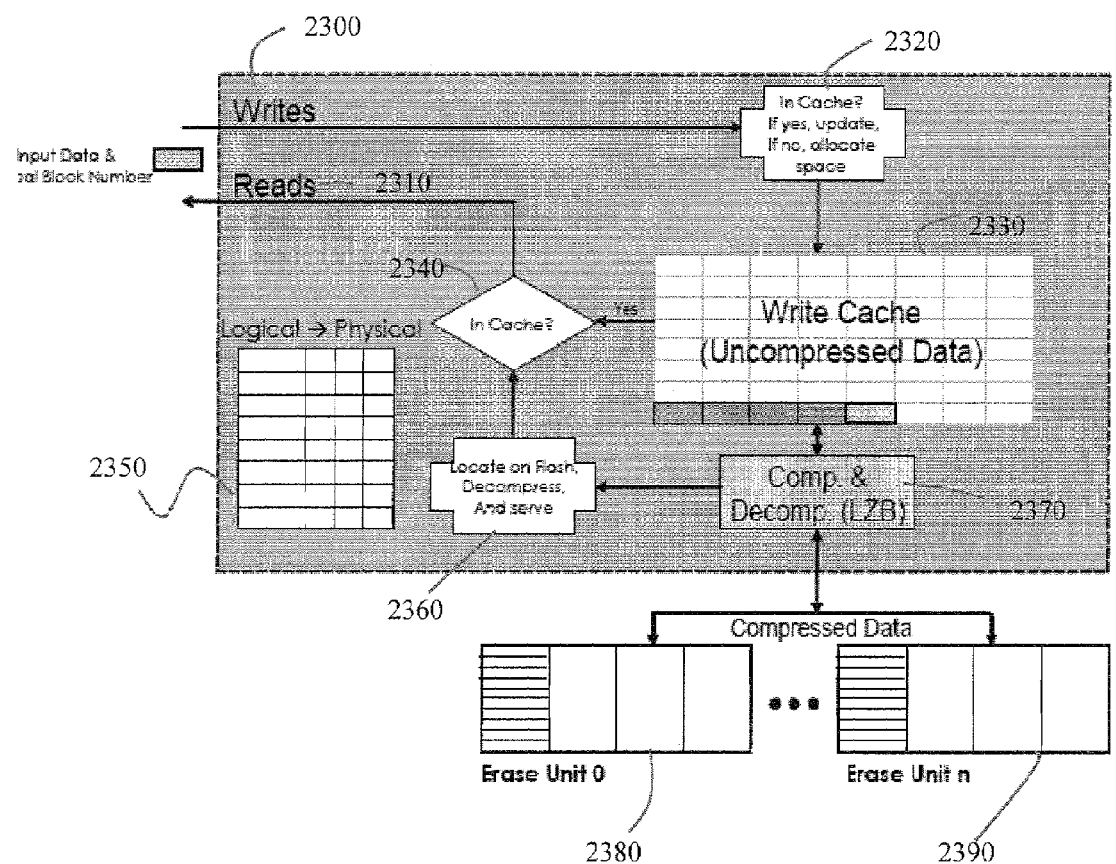
FIG. 9 illustrates a system diagram according to one embodiment.

In one embodiment, as described herein with regard to FIG. 9, there is a hardware compression and decompression unit (e.g., a hardware compression and decompression unit 2370) executing the LZ77, LZ78, LZW and/or LZB algorithms. When the compression or decompression is necessary due to read requests or write requests from/to the main memory, the hardware compression and decompression unit performs the necessary compression and/or decompression.

FIG. 9 illustrates a system diagram according to one embodiment of the present invention. When a read request 2310 arrives at a processor (not shown), the processor or hardware logic 2340 examines whether a cache memory 2330 has data requested to be read. Though FIG. 9 illustrates only one cache memory, there may be two or more cache memory levels. The cache memories include only uncompressed data. If the cache memory 2330 has the data requested to be read, the cache memory 2330 serves the data to the processor or to the logic 2340. Otherwise, the processor or a hardware module 2360 accesses a main memory 2380 or 2390, which includes compressed data only. The processor or the hardware module 2360 may locate a specific address of the main memory to read the data requested to be read, e.g., by using the indirection table 2350. Since data stored in the main memory is compressed, a hardware compression and decompression unit 2370 preferably implementing the LZB algorithm decompresses the data. Because the hardware compression and decompression unit 2370 is implemented, in one embodiment, based on the LZB algorithm, the hardware compression and decompression unit 2370 can decompress only a specific portion of the main memory corresponding to the specific address to obtain the uncompressed data. The unit 2370 may provide the uncompressed data to the processor and/or the module 2360.

When a write request 2300 arrives at the processor, a hardware component 2320 or the processor checks whether an address associated with the write request exists in the cache memory 2330. If the cache memory 2330 has an entry corresponding to the address, the component 2320 or the processor overwrites data in the entry with data provided with the write request. Otherwise, the component 2320 or the processor writes the provided data in an available or empty entry in the cache memory. A cache line in the cache memory 2330 may include multiple entries. When a cache line in the cache memory 2330 becomes full, the processor or the unit 2370 compresses the whole cache line, e.g., by preferably using LZB algorithm, and then stores the compressed cache line in the main memory 2380 or 2390. At the same time, the processor updates a corresponding entry in the indirection table 2350, e.g., by creating an entry storing a mapping between logical address(es) of each entry in the (uncompressed) cache line and corresponding physical address(es) in the compressed cache line.

In one embodiment, there may be a hardware entity (not shown) performing wear leveling. Then, a useful life of the main memory further increase by reducing the number of writes to the main memory and by evenly distributing the writes across the main memory, e.g., by implementing the wear leveling.

In one embodiment, the logic 2340, the module 2360, the unit 2370, the component 2320 and the entity are implemented as hardware or reconfigurable hardware, e.g., FPGA (Field Programmable Gate Array) or CPLD (Complex Programmable Logic Device), using a hardware description language (Verilog, VHDL, Handel-C, or System C). In another embodiment, the logic 2340, the module 2360, the unit 2370, the component 2320 and the entity are implemented on a semiconductor chip, e.g., ASIC (Application-Specific Integrated Circuit), using a semi-custom design methodology, i.e., designing a chip using standard cells and a hardware description language.

Although the embodiments of the present invention have been described in detail, it should be understood that various changes and substitutions can be made therein without departing from spirit and scope of the inventions as defined by the appended claims. Variations described for the present invention can be realized in any combination desirable for each particular application. Thus particular limitations, and/or embodiment enhancements described herein, which may have particular advantages to a particular application need not be used for all applications. Also, not all limitations need be implemented in methods, systems and/or apparatus including one or more concepts of the present invention.

The present invention can be realized in hardware, software, or a combination of hardware and software. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context include any expression, in any language, code or notation, of a set of instructions intended to cause a system having an information processing capability to perform a particular function either directly or after conversion to another language, code or notation, and/or reproduction in a different material form.

Thus the invention includes an article of manufacture which comprises a computer usable medium having computer readable program code means embodied therein for causing a function described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a function described above. The computer readable program code means in the computer program product comprising computer readable program code means for causing a computer to effect one or more functions of this invention. Furthermore, the present invention may be implemented as a program storage device readable by machine, tangibly embodying a program of instructions executable by the machine to perform method steps for causing one or more functions of this invention.

The present invention may be implemented as a computer readable medium (e.g., a compact disc, a magnetic disk, a hard disk, an optical disk, solid state drive, digital versatile disc) storing program computer instructions (e.g., C, C++, Java, Assembly languages, .Net, Binary code) executed by a processor (e.g., Intel® Core™, IBM® PowerPC®) for causing a computer to perform method steps of this invention. The present invention may include a method of deploying a computer program product including a program of instructions in a computer readable medium for one or more functions of this invention, wherein, when the program of instructions is executed by a processor, the compute program product performs the one or more of functions of this invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

What is claimed is:

1. A method for reducing the number of writes in a main memory of a computer device having a processor, the computer device having one or more levels of cache memory, the method comprising:
   receiving a write request to write data;
   evaluating whether the data is already in at least one cache memory;

writing the data in the at least one cache memory, if the data is not in the at least one cache memory;

locating compressed data in the main memory, the compressed data corresponding to a previously stored version of the written data;

marking an entry in the main memory corresponding to the compressed data as invalid; and filling a cache line in a lowest-level cache memory with the written data.

2. The method according to claim 1, wherein the cache line comprises a plurality of data associated with a plurality of write requests issued from the at least one cache memory or the processor.

3. The method according to claim 1, wherein the locating the compressed data in the main memory includes: using an indirection table, the indirection table including information of a size of the compressed data and an address indicating a location of the compressed data stored in the main memory.

4. The method according to claim 3, further comprising:
compressing content of the cache line for storing in the main memory; and
updating a corresponding entry in the indirection table used for an address translation between a logical address of the at least one cache memory and a physical address in the main memory,
wherein as a result of the compressing, fewer amounts of data is written to the main memory.

5. The method according to claim 4, wherein the content of the cache line is compressed when the cache line is full, the number of used cache lines reached a threshold, or there is a need for an empty entry in the lowest-level cache memory.

6. The method according to claim 4, wherein if the cache line is logically divided into segments, the corresponding entry in the indirection table stores a location of a beginning of each segment in the compressed content.

7. The method according to claim 6, further comprising:
decompressing only a portion of the compressed content, when a specific segment in the compressed content is accessed for a read request, the portion including data corresponding to the specific segment.

8. The method according to claim 7, wherein the decompressing can be performed from any location of the compressed content.

9. The method according to claim 7, wherein the compressing and the decompressing are performed by one or more of: LZ77, LZ78, LZW an LZB.

10. A computer readable medium storing computer program instructions being executed by a processor for causing a computer device to perform method steps for reducing the number of writes in a main memory of the computer device having the processor, the computer device having one or more levels of cache memory, said method steps comprising the steps of claim 1.

11. A method of deploying a computer program product including programs of instructions in a computer readable medium for reducing the number of writes in a main memory of a computer device having a processor, the computer device having one or more levels of cache memory, wherein, when the programs of instructions are executed by the processor, the computer program product performs the steps of claim 1.

12. A system for reducing the number of writes in a main memory, the method comprising:
means for receiving a write request to write data;
means for evaluating whether the data is already in at least one cache memory;
means for writing the data in the at least one cache memory, if the data is not in the at least one cache memory;
means for locating compressed data in the main memory, the compressed data corresponding to a previously stored version of the written data;
means for marking an entry in the main memory corresponding to the compressed data as invalid; and
means for filling a cache line in a lowest-level cache memory with the written data.

13. A computer-implemented method for compressing an input data stream, the method comprising:
specifying a gate distance as a particular number of bits and a window size as a certain number of bits;
evaluating whether a current string in the input data stream has been found before within the window size;
locating an origin of symbols in the current string within the input data stream if the current string has been found before within the window size;
calculating a difference between a start position of the current string and a position of the origin;
checking whether the difference is larger than the gate distance;
finding a matching string at the position of the origin if the difference is equal to or less than the gate distance; and
replacing the current string with a reference to the matching string and a length of the matching string,
wherein a size of the input data stream is reduced by replacing the current string with the reference to the matching string and the length of the matching string.

14. The computer-implemented method according to claim 13, wherein the matching string is exactly matched with the current string.

15. The computer-implemented method according to claim 13, wherein the matching string is partially matched with the current string.

16. The computer-implemented method according to claim 13, wherein the size of the input data stream is reduced by a size of the current string—a size of the reference.

17. The computer-implemented method according to claim 13, further comprising:
moving to a next string in the input data stream;
setting the next string as the current string; and
repeating the evaluating, the locating, the calculating, the checking, the finding, the replacing, the moving and the setting.

18. The computer-implemented method according to claim 13, further comprising:
ignoring the matching string at the position of the origin if the difference is larger than the gate distance.

19. The computer-implemented method according to claim 13, further comprising:
providing an external dictionary having commonly used strings;
evaluating whether the current string is found at the external dictionary; and
locating the matching string in the external dictionary, if the current string is found at the external dictionary.

20. The computer-implemented method according to claim 19, wherein when the matching string is found at the position of the origin or the external dictionary, the size of the input data stream is minimized.

21. A computer-implemented method for decompressing a compressed data stream, the method comprising:
evaluating whether a current string in the compressed data stream represents a (a reference location, a length value) pair, the reference location of said pair indicating a location of an original string corresponding to the current string in the compressed data stream, the length value of said pair indicating the number of symbols in the original string;

finding an original string at a position of the reference location, the original string having the length number of symbols, if the current string is the pair; and replacing the current string with the original string, wherein the compressed data stream is reconstructed to an uncompressed data stream by replacing the current string with the original string.

22. A computer-implemented method according to claim 21, the method further comprising:

maintaining a list of markers specifying a mapping between positions in an uncompressed data stream and positions in the compressed data stream.

23. The computer-implemented method according to claim 22, wherein the evaluating, the finding and the replacing starts at any position of the compressed data stream by using the list of markers without requiring starting from a beginning of the compressed data stream.

24. The computer-implemented method according to claim 21, further comprising:

providing an external dictionary storing commonly used strings, wherein the reference indicates a position of the original string in the compressed data stream or an entry location including the original string in the external dictionary.

* * * * *